(12) United States Patent
Rhodes (10) Patent No.: US 6,611,013 B2
(45) Date of Patent: Aug. 26, 2003

(54) CMOS IMAGER WITH SELECTIVELY SILICIDED GATES

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 09/777,890

(22) Filed: Feb. 7, 2001

(65) Prior Publication Data

US 2001/0012225 A1 Aug. 9, 2001

Related U.S. Application Data

(62) Division of application No. 09/374,990, filed on Aug. 16, 1999, now Pat. No. 6,333,705.

(51) Int. Cl.[7] .............................................. H01L 31/062
(52) U.S. Cl. ...................... 257/292; 257/294; 257/382
(58) Field of Search ................................. 257/215, 216, 257/222, 290, 291, 292, 293, 294, 382, 383, 384

(56) References Cited

U.S. PATENT DOCUMENTS

| | | |
|---|---|---|
| 4,374,700 A | 2/1983 | Scott et al. |
| 5,055,667 A * | 10/1991 | Sayag ..................... 250/208.1 |
| 5,319,604 A | 6/1994 | Imondi et al. |
| 5,461,425 A | 10/1995 | Fowler et al. |
| 5,471,515 A | 11/1995 | Fossum et al. |
| 5,541,402 A | 7/1996 | Ackland et al. |
| 5,576,763 A | 11/1996 | Ackland et al. |
| 5,612,799 A | 3/1997 | Yamazaki et al. |
| 5,614,744 A | 3/1997 | Merrill |
| 5,625,210 A | 4/1997 | Lee et al. |
| 5,705,846 A | 1/1998 | Merrill |
| 5,708,263 A | 1/1998 | Wong |
| 5,739,562 A | 4/1998 | Ackland et al. |
| 5,757,045 A | 5/1998 | Tsai et al. |
| 5,909,041 A * | 6/1999 | Hosier et al. ................ 257/292 |
| 6,160,282 A * | 12/2000 | Merrill ......................... 257/292 |

OTHER PUBLICATIONS

Dickinson, A., et al., *A 256x256 CMOS Active Pixel Image Sensor with Motion Detection*, 1995 IEEE International Solid–State Circuits Conference, pp. 226–227.

Dickinson, A., et al., *Standard CMOS Active Pixel Image Sensors for Multimedia Applications*, Proceedings of Sixteenth Conference on Advanced Research in VLSI, Mar. 27–29, 1995, pp. 214–224.

Eid, E–S., et al., *A 256 x 256 CMOS Active Pixel Image Sensor*, Proc. SPIE vol. 2415, Apr. 1995, pp. 265–275.

Fossum, E., *CMOS Image Sensors: Electronic Camera On A Chip*, 1995, IEEE, pp. 17–25.

Fossum, E., et al., *IEDM A 37x28mm² 600K—Pixel CMOS APS Dental X–Ray Camera–on–a–Chip with Self–Triggered Readout*, 1998 IEEE International Solid–State Circuits Conference, pp. 172–173.

Fossum, E., *Low Power Camera–on–a–Chip Using CMOS Active Pixel Sensor Technology* 1995 IEEE, pp. 74–77.

Fossum, E., *Architectures for focal plane image processing*, Optical Engineering, vol. 28, No. 8, Aug. 1989, pp. 865–871.

(List continued on next page.)

Primary Examiner—T. N. Quach
(74) Attorney, Agent, or Firm—Dickstein Shapiro Morin & Oshinsky LLP (57) ABSTRACT

The invention also relates to an apparatus and method for selectively providing a silicide coating over the transistor gates of a CMOS imager to improve the speed of the transistor gates. The method further includes an apparatus and method for forming a self aligned photo shield over the CMOS imager.

32 Claims, 8 Drawing Sheets

OTHER PUBLICATIONS

Janesick, J., et al., *New advancements in charge–coupled device technology—sub–electron noise and 4096x4096 pixel CCDs*, Proc. SPIE vol. 1242, 1990, pp. 223–237.

Kemeny, S.E., et al., *Update on focal–plane image processing research*, Proc. SPIE vol. 1447, 1991, pp. 243–250.

Mendis, S., et al., *CMOS Active Pixel Image Sensor*, IEEE Transactions on Electron Devices, vol. 41, No. 3, Mar. 1994, pp. 452–453.

Mendis, S.K., et al., *A 128 x 128 CMOS Active Pixel Image Sensor for Highly Integrated Imaging Systems*, 1993 IEEE, pp. 583–586.

Mendis, S.K., et al., *CMOS Active Pixel Image Sensors for Highly Integrated Imaging Systems*, IEEE Journal of Solid–State Circuits, vol. 32, No. 2, Feb. 1997, pp. 187–197.

Mendis, S.K., et al., *Design of a Low–Light–Level Image Sensor with On–Chip Sigma–Delta Analog–to–Digital Conversion*, Proc. SPIE vol. 1900, Jul. 1993, pp. 31–39.

Mendis, S.K., et al., *Low–Light–Level Image Sensor with On–Chip Signal Processing*, Proc SPIE vol. 1952, Nov. 1993, pp. 23–33.

Mendis, S.K., et al., *Progress In CMOS Active Pixel Image Sensors*, Proc. SPIE vol. 2172 May 1994, pp. 19–29.

Nakamura, J., et al., *CMOS Active Pixel Image Sensor with Simple Floating Gate Pixels*, IEEE Transactions on Electron Devices, vol. 42, No. 9, Sep. 1995, pp. 1693–1694.

Nixon, R.H., et al., *256 x 256 CMOS Active Pixel Sensor Camera–on–a–Chip*, IEEE Journal of Solid–State Circuits, vol. 31, No. 12, Dec. 1996, pp. 2046–2050.

Nixon, R.H., et al., *256x256 CMOS Active Pixel Sensor Camera–on–a–Chip*, 1996 IEEE International Solid–State Circuits Conference, pp. 178–179.

Panicacci, R., et al., *Programmable multiresolution CMOS active pixel sensor*, Proc. SPIE vol. 2654, Mar. 1996, pp. 72–79.

Panicacci, R.A., et al., *128Mb/s Multiport CMOS Binary Active–Pixel Image Sensor*, 1996 IEEE International Solid–State Circuit Conference, pp. 100–101.

Yadid–Pecht, O., et al., *CMOS Active Pixel Sensor Star Tracker with Regional Electronic Shutter*, IEEE Journal of Solid–State Circuits, vol. 32, No. 2, Feb. 1997, pp. 285–288.

Yadid–Pecht, O., et al., *Wide dynamic range APS star tracker*, Proc. SPIE vol. 2654, Mar. 1996, pp. 82–92.

Zarnowski, J., et al., *Imaging options expand with CMOS technology*, Laser Focus World, Jun. 1997, pp. 125–130.

Zhou, Z., et al., *A Cmos Imager with On–Chip Variable Resolution for Light–Adaptive Imaging*, 1998, IEEE International Solid–State Circuits Conference, pp. 174–175.

Zhou, Z., et al., *A Digital CMOS Active Pixel Image Sensor For Multimedia Applications*, Proc. SPIE vol. 2894, Sep. 1996, pp. 282–288.

\* cited by examiner

CMOS IMAGER WITH SELECTIVELY SILICIDED GATES

This application is a divisional of application Ser. No. 09/374,990, filed on Aug. 16, 1999, now U.S. Pat. No. 6,333,705 which is hereby incorporated by reference.

FIELD OF THE INVENTION

The invention relates generally to improved semiconductor imaging devices and in particular to an imaging device which can be fabricated using a standard CMOS process. Particularly, the invention relates to a method for providing a silicide coating over the transistor gates used in a CMOS imager to improve the operating speed of the transistors.

DISCUSSION OF RELATED ART

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate, or a photoconductor. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Figure 1:
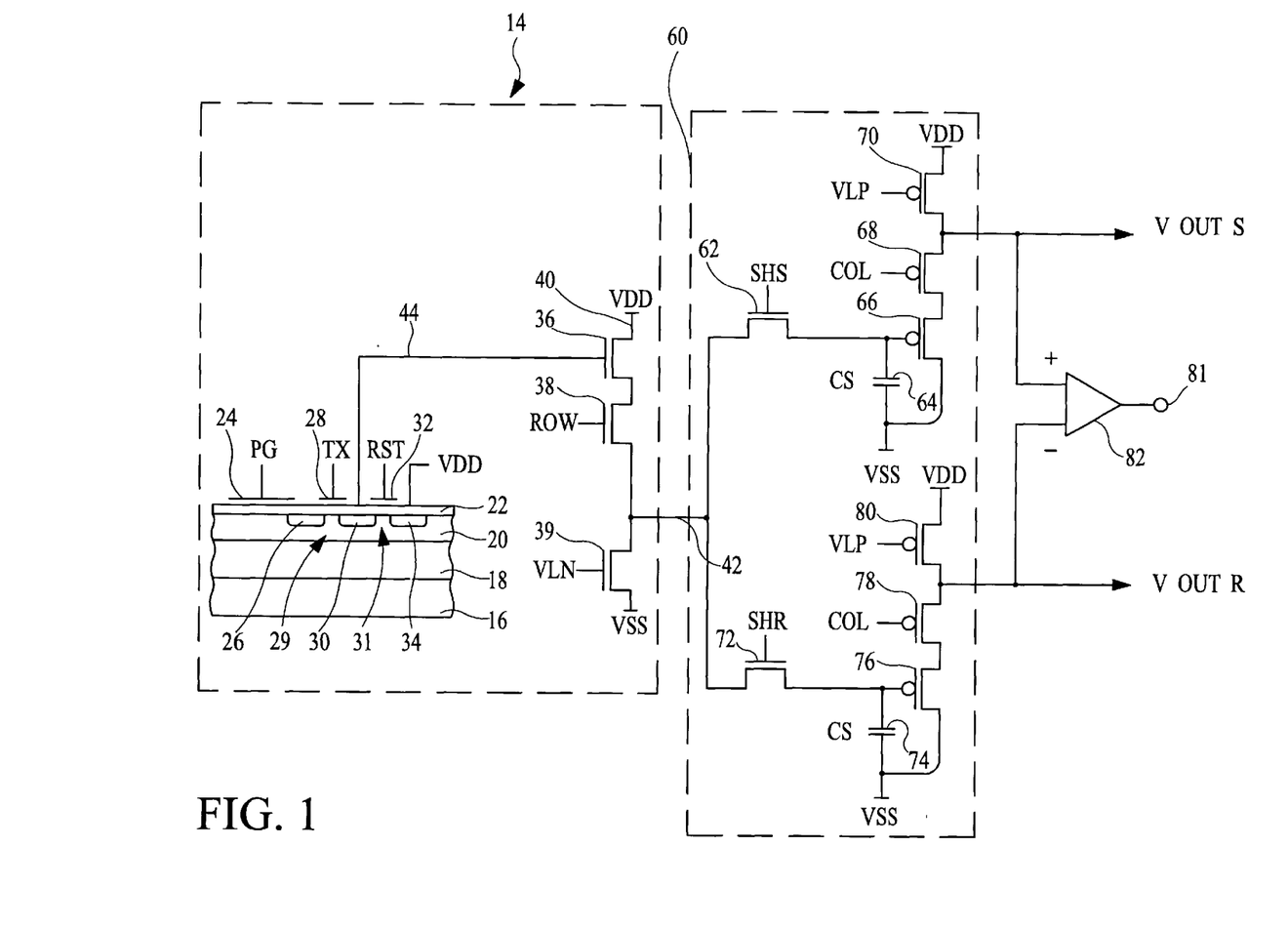
FIG. 1 is a representative circuit of a CMOS imager.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of an amplifying transistor, such as source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS−VOUTR) by subtractor 82 to provide an output signal terminal 81 which is an image signal independent of pixel to pixel variations caused by fabrication variations in the reset voltage transistor 31 which might cause pixel to pixel variations in the output signal.

Figure 2:
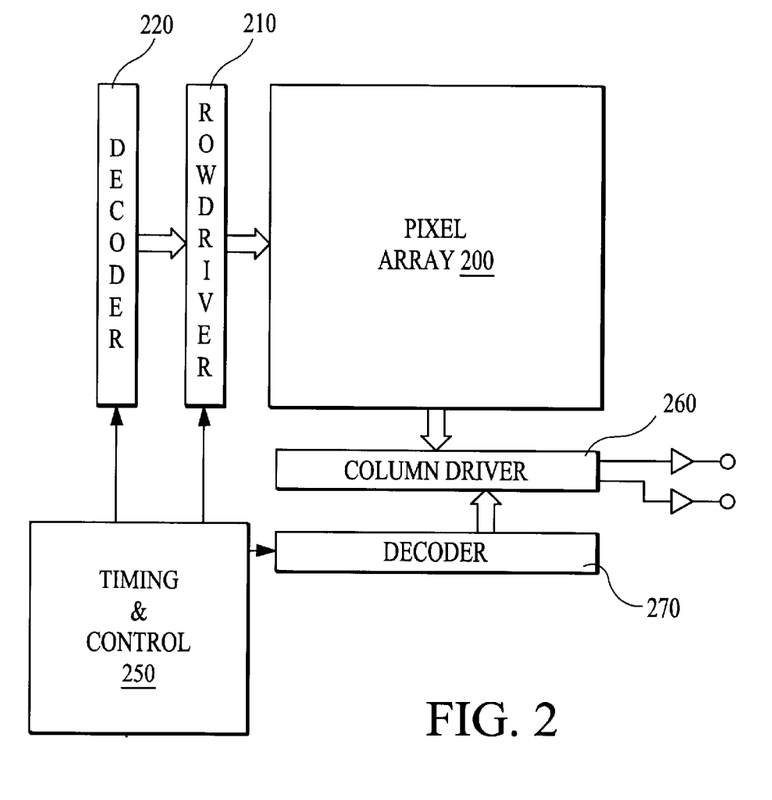
FIG. 2 is a block diagram of a CMOS active pixel sensor chip.

FIG. 2 illustrates a block diagram for a CMOS imager having a pixel array 200 with each pixel cell being constructed in the manner shown by element 14 of FIG. 1. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

Figure 3:
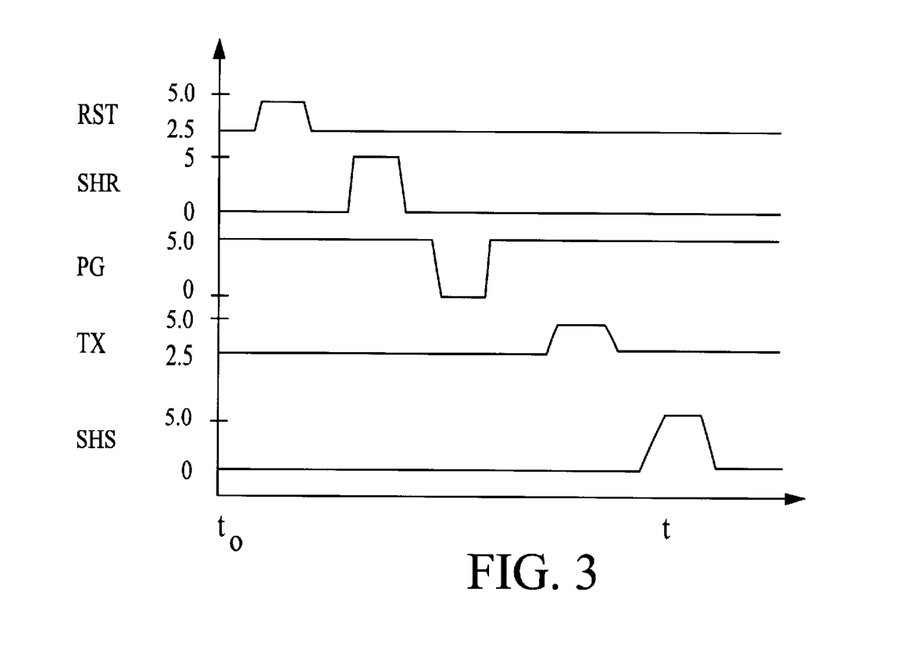
FIG. 3 is a representative timing diagram for the CMOS imager.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD−Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17–25 (1995) as well as other publications. These references are incorporated herein by reference.

In the prior art, the desire to incorporate a silicide over the gate stack to improve speed was hampered by the undesirable effect the silicide layer had on the photogate. If the photogate is covered by a silicide layer, the collection of charge is inhibited by the blocking of light by the silicide layer. It is for this reason that photogate type devices have not been able to use a silicide gate stack. Since the size of the pixel electrical signal is very small due to the collection of photons in the photo array, the signal to noise ratio of the pixel should be as high as possible within a pixel. Accordingly, all possible charge should be collected by the photocollection device.

SUMMARY OF THE INVENTION

The present invention provides an imaging device formed as a CMOS integrated circuit using a standard CMOS process. The invention relates to a method for providing a more conductive layer, such as a silicide or a barrier/metal layer, incorporated into the transistor gates of a CMOS imager to improve the speed of the transistor gates, but selectively removing the silicide or barrier/metal from a photogate to prevent blockage of the photogate.

The above and other advantages and features of the invention will be more clearly understood from the following detailed description which is provided in connection with the accompanying drawings.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. It should be understood that like reference numerals represent like elements. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 4:
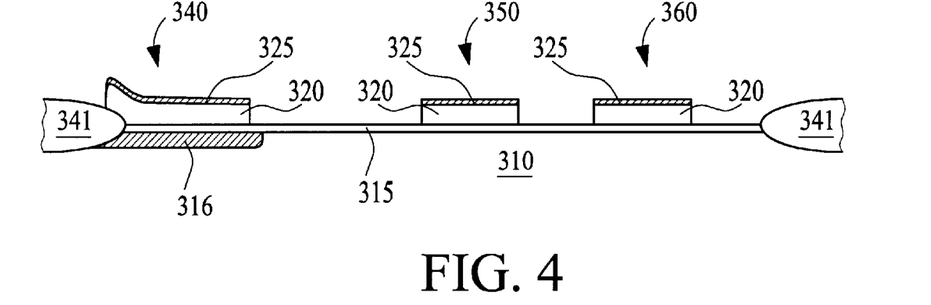
FIG. 4 illustrates a partially cut away side view of a portion of a semiconductor CMOS imager wafer in an interim stage of processing.

Reference is now made to FIG. 4. This figure shows a partially cut away side view of a portion of a semiconductor CMOS imager wafer in an interim stage of processing according to a first aspect of the present invention. The imager includes a substrate 310 preferably doped to a first conductivity type. For exemplary purposes, it is assumed that the substrate 310 is a well doped to a p-type conductivity, i.e., a p-well. Substrate 310 has an n-doped region 316 therein for photocollection. An insulating layer 315 is formed over the substrate 310. The insulating layer is preferably a silicon dioxide grown on the substrate 310 by conventional means such as thermal oxidation of silicon. The substrate 310 has field oxide regions 341 formed using the Local Oxidation of Silicon (LOCOS) process to surround and isolate the cells which may be formed by thermal oxidation. While the invention is described with reference to LOCOS formed field oxide regions 341, it should be understood that the field oxide regions may be formed with shallow trench isolation (STI).

A photogate 340, a transfer gate 350 and a reset gate 360 have been fabricated over the insulating layer 315. The gates 340, 350, 360 include a doped polysilicon layer 320 covered by a more conductive layer such as a barrier/metal layer or silicide layer 325 or refractory metal silicide or barrier metal, if desired, according to conventional methods. Preferably the silicide is a tungsten, titanium, tantalum, molybdenum or cobalt silicide. The barrier metal may be those such as titanium nitride, tungsten nitride or the like. Preferably the barrier metal is formed of a TiN/W, $WN_x$/W or $WN_x$.

The doped polysilicon layers 320 may be formed by conventional methods, such as chemical vapor deposition (CVD). Conductive layer 325 of titanium, tantalum, cobalt or tungsten is then deposited using a chemical vapor deposition (CVD), sputtering or a physical vapor deposition (PVD) of the silicide or a CVD or PVD deposition of the metal followed by a thermal step to cause the metal to react with the underlying polysilicon to form the metal silicide. The wafer is then annealed at approximately 600° C. to about 800° C. for approximately 30 seconds in a nitrogen environment to react with a portion of the polysilicon layer 320 to form conductive layer 325. The excess metal is then removed to arrive at the structure shown in FIG. 4. Preferably the conductive layer 325 is formed by depositing $WSi_x$ over the doped polysilicon layers 320. The $WSi_x$ may be deposited onto the doped polysilicon layers 320 by conventional methods such as CVD. Photoresist is then used to define features 340, 350, 360 and the silicide and polysilicon layers and etched, preferably using a dry etch that stops in the underlying gate oxide. The resist is stripped and the wafer is shown in FIG. 4.

Figure 5:
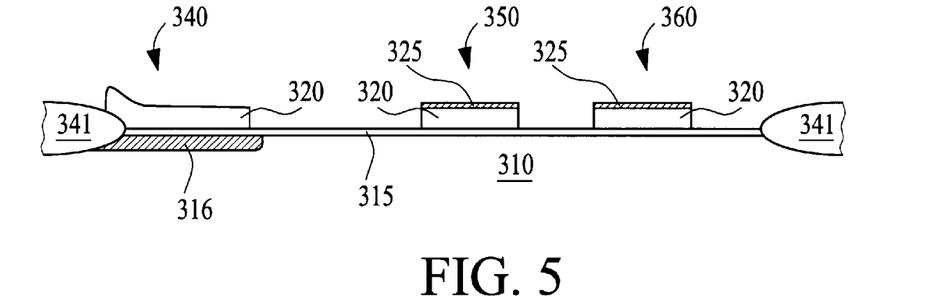
FIG. 5 illustrates a partially cut away side view of a portion of a semiconductor CMOS imager wafer subsequent to FIG. 4.

The substrate is then patterned, exposing the photogate, and the conductive layer 325 is removed from the photogate 340 by a wet or dry etch to arrive at the device as shown in FIG. 5. The conductive layer 325 remains over both the transfer gate 350 and the reset gate 360 after the pattern mask is removed. This process improves the speed of the fabricated transistor gates by depositing a conductive layer on these gates while the process removes the conductive layer from the photogate 340 to prevent blockage of the photo-generated charge. Thus, the transistor gates 350, 360 have the desired speed due to the presence of the silicide but the area of the photogate 340 is not shielded by the silicide.

Figure 6:
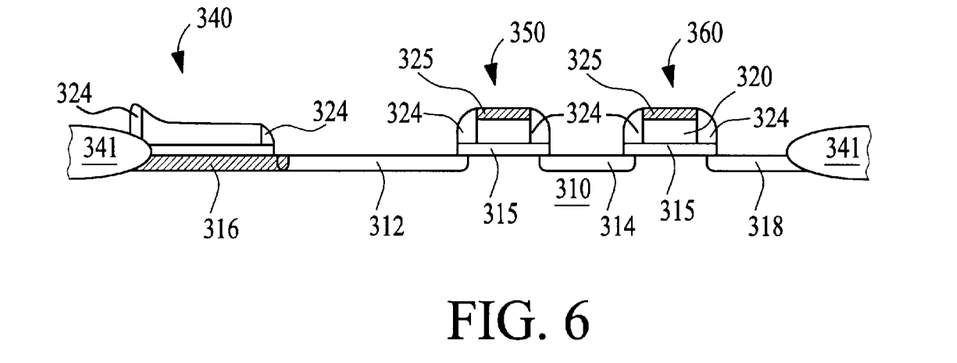
FIG. 6 illustrates a partially cut away side view of a portion of a semiconductor CMOS imager wafer subsequent to FIG. 5.

Spacers 324 are formed along the sides of the gate stacks 340, 350, 360 as shown in FIG. 6. The spacers 324 may be formed of TEOS (tetraethyloxysilicate) or silicon nitride using conventional deposition and etch back technique. A resist and mask (not shown) are used to shield areas of the substrate 310 that are not to be doped. The doped regions 312, 314, 318 are then formed in the substrate 310. The doped regions 312, 314, 318 are doped to a second conductivity type, which for exemplary purposes will be considered to be n-type. The doping level of the doped regions 312, 314, 318 may be different but for process simplicity could all be heavily n+ doped with arsenic, antimony of phosphorous at an implant dose of from about $1 \times 10^{15}$ ions/cm$^2$ to about $1 \times 10^{16}$ ions/cm$^2$. There may be other implants (not shown) to set transistor threshold voltages, provide short channel punch-through protection, provide improved field isolation, etc. as is known in the art.

For the pixel cell of the first embodiment, the photosensor cell is essentially complete at this stage, and conventional processing methods may then be used to form contacts and wiring to connect gate lines and other connections in the pixel cell. For example, the entire surface may then be covered with a passivation layer of, e.g., silicon dioxide, BPSG, PSG, BSG or the like which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 7:
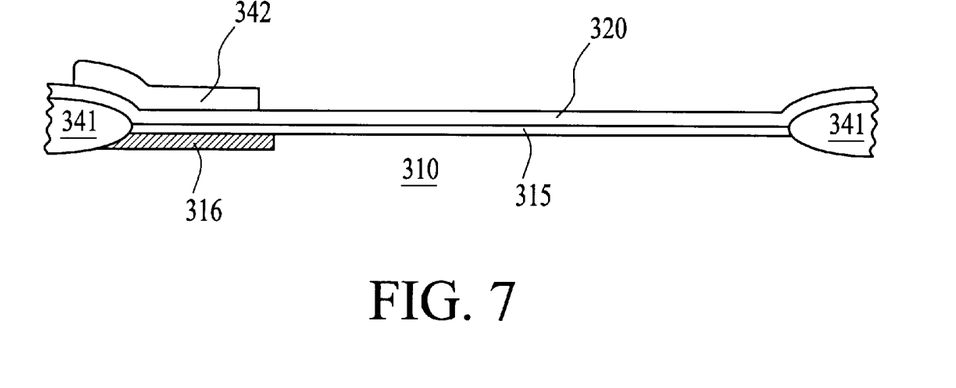
FIG. 7 illustrates a partially cut away side view of a portion of a semiconductor CMOS imager wafer in an interim stage of processing according to a further embodiment of the present invention.

Reference is now made to FIG. 7. This figure shows a partially cut away side view of a portion of a semiconductor CMOS imager wafer in an interim stage of processing according to a second embodiment of the present invention. The imager includes a p-well substrate 310 having n-doped region 316 therein for photocollection. An insulating layer 315 is formed over the substrate 310. The insulating layer is preferably a silicon dioxide grown on the substrate 310 by conventional means such as thermal oxidation of silicon. The substrate 310 has field oxide regions 341 formed to surround and isolate the cells which may be formed by thermal oxidation of silicon using the LOCOS process. While the invention is described with reference to field oxide regions 341, it should be understood that the field oxide regions may be replaced with shallow trench isolation (STI). A doped polysilicon layer 320 may be formed by conventional methods, such as chemical vapor deposition (CVD) over the insulating layer 315. A photogate insulator 342 grown or deposited over layer 320 and is patterned over the polysilicon layer 320 above n-doped region 316 as shown in FIG. 7.

Figure 8:
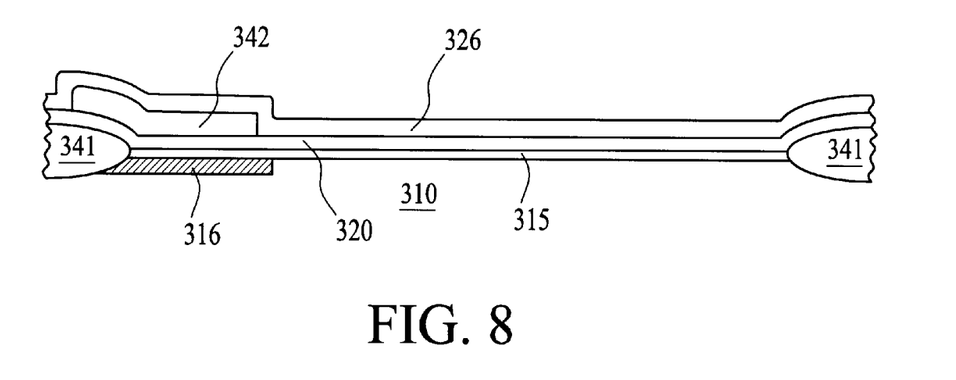
FIG. 8 illustrates a partially cut away side view of a portion of a semiconductor CMOS imager wafer subsequent to FIG. 7.
Figure 9:
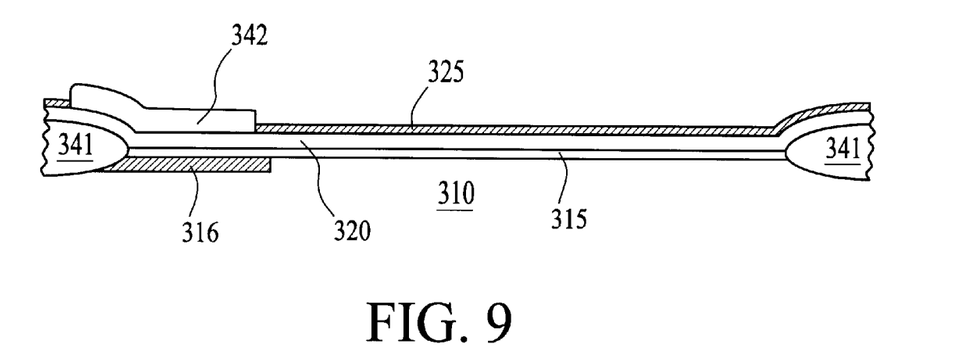
FIG. 9 illustrates a partially cut away side view of a portion of a semiconductor CMOS imager wafer subsequent to FIG. 8.

Referring now to FIG. 8, a metal layer 326 of titanium or cobalt is then deposited using CVD or PVD technique, preferably sputtering. The wafer is then annealed at approximately 600° C. to about 800° C. for approximately 30 seconds in a nitrogen environment to react with a portion of the polysilicon layer 320 to form conductive layer 325. The unreacted metal layer 326 over insulating regions such as 342 is then removed to arrive at the structure shown in FIG. 9.

Figure 10:
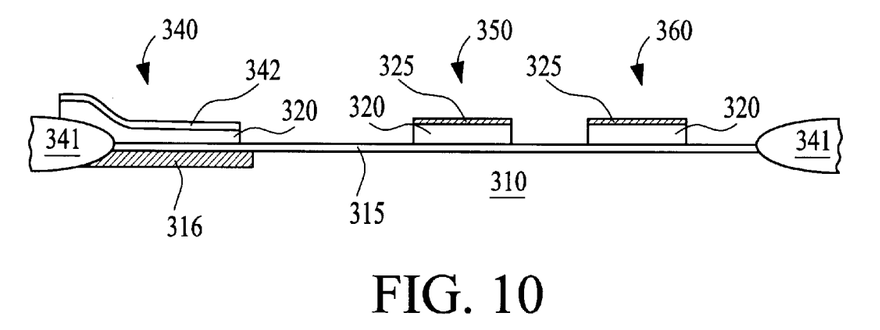
FIG. 10 illustrates a partially cut away side view of a portion of a semiconductor CMOS imager wafer subsequent to FIG. 9.

A resist and mask (not shown) is then applied to the substrate 310 and the wafer is patterned and the silicide and polysilicon layers are etched to form transfer gate 350 and reset gate 360 over the substrate 310 as shown in FIG. 10. While the photogate insulation 342 does not have to be removed, it may be removed if desired. FIG. 10 shows the insulator 342 left in place. The gates 350 and 360 include the doped polysilicon layer 320 covered by conductive layer 325. The conductive layer 325 is selectively removed from the substrate 310 as shown in FIG. 10 by a wet or dry etch or other chemical and/or mechanical methods in regions not protected by the patterned photoresist. The conductive layer 325 remains over both the transfer gate 350 and the reset gate 360 after the pattern mask is removed. This process improves the speed of the transistor gates by depositing a silicide layer on these gates while the process selectively prevents silicide from forming over the photogate region 340 by using a patterned insulating layer 342 to prevent blockage of the photo-generated charge. Thus, the transistor gates 350, 360 have the desired speed due to the presence of the silicide but the area of the photogate 340 is not shielded by the silicide.

Figure 11:
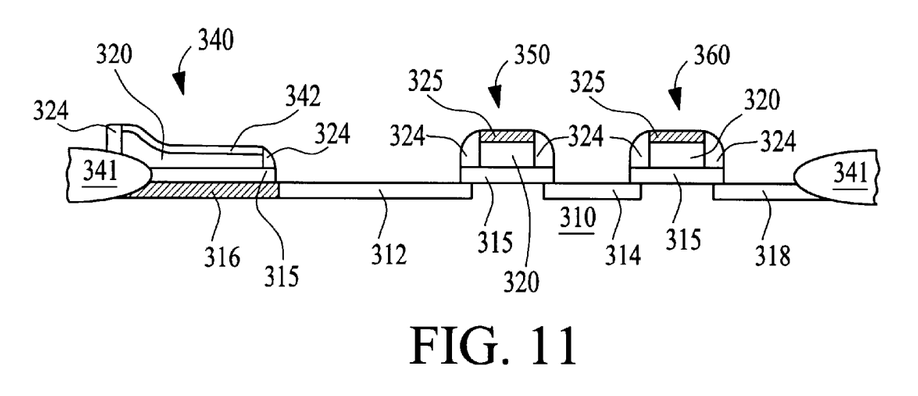
FIG. 11 illustrates a partially cut away side view of a portion of a semiconductor CMOS imager wafer subsequent to FIG. 10.

Spacers 324 are formed along the sides of the gate stacks 340, 350, 360 as shown in FIG. 11. The spacers 324 may be formed of any insulator such as oxide or nitride using conventional deposition and anisotropic etch back technique. A resist and mask (not shown) is further used to shield areas of the substrate 310 that are not to be doped. The doped regions 312, 314, 318 are then formed in the substrate 310. The doped regions 312, 314, 318 are doped to a second conductivity type, which for exemplary purposes will be considered to be n-type. The doping level of the doped regions 312 may vary but preferably are heavily n+ doped with arsenic, antimony of phosphorous at a dopant concentration level of from about $1\times10^{15}$ ions/cm$^2$ to about $1\times10^{16}$ ions/cm$^2$. Separate masking photoresist layers may be used to implant regions 312, 314, 318 to differing dopant concentrations or a single mask may be used to implant them all the same concentration.

For the pixel cell of the second embodiment, the photosensor cell is essentially complete at this stage, and conventional processing methods may then be used to form contacts and wiring to connect gate lines and other connections in the pixel cell. For example, the entire surface may then be covered with a passivation layer of, e.g., silicon dioxide, BPSG, PSG, BSG or the like which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 12:
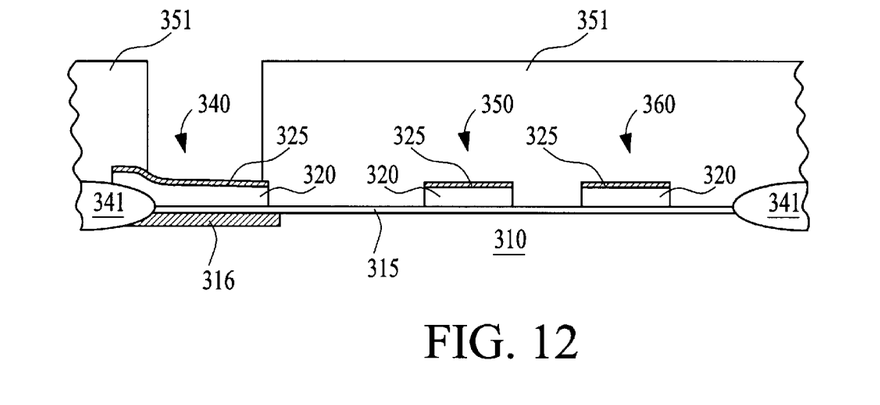
FIG. 12 illustrates a partially cut away side view of a portion of a semiconductor CMOS imager wafer in an interim stage of processing according to a second embodiment of the present invention.

Reference is now made to FIG. 12. This figure shows a partially cut away side view of a portion of a semiconductor CMOS imager wafer in an interim stage of processing according to a second embodiment of the present invention. The imager includes a substrate 310 preferably doped to a first conductivity type. For exemplary purposes, it is assumed that the substrate 310 is a well doped to a p-type conductivity, i.e., a p-well. Substrate 310 has an n-doped region 316 therein for photocollection. An insulating layer 315 is formed over the substrate 310. The insulating layer is preferably a silicon dioxide grown on the substrate 310 by conventional means such as thermal oxidation of silicon. The substrate 310 has field oxide regions 341 formed using the LOCOS process to surround and isolate the cells which may be formed by thermal oxidation. While the invention is described with reference to LOCOS formed field oxide regions 341, it should be understood that the field oxide regions may be formed using replaced with shallow trench isolation (STI).

A photogate 340, a transfer gate 350 and a reset gate 360 have been fabricated over the insulating layer 315. The gates 340, 350, 360 include a doped polysilicon layer 320 covered by a more conductive layer such as a barrier/metal layer or suicide layer 325. Preferably the silicide is a tungsten, titanium, tantalum, molybdenum or cobalt silicide. The barrier metal may be those such as titanium nitride, tungsten nitride or the like. Preferably the barrier metal is formed of a TiN/W, WN$_x$/W or WN$_x$. The doped polysilicon layers 320 may be formed by conventional methods as described above. Conductive layer 325 of titanium, tantalum, cobalt or tungsten is then deposited using a chemical vapor deposition (CVD) or a physical vapor deposition (PVD) of the silicide or a CVD or PVD deposition of the metal followed by a thermal step to cause the metal to react with the underlying polysilicon to form the metal silicide. The wafer is then annealed at approximately 600° C. to about 800° C. for approximately 30 seconds in a nitrogen environment to react with a portion of the polysilicon layer 320 to form conductive layer 325. The excess metal is then removed. Preferably the conductive layer 325 is formed by depositing WSi$_x$ over the doped polysilicon layers 320. The WSi$_x$ may be deposited onto the doped polysilicon layers 320 by conventional methods such as CVD. A photoresist layer 351 is formed and patterned over photogate 340.

Figure 13:
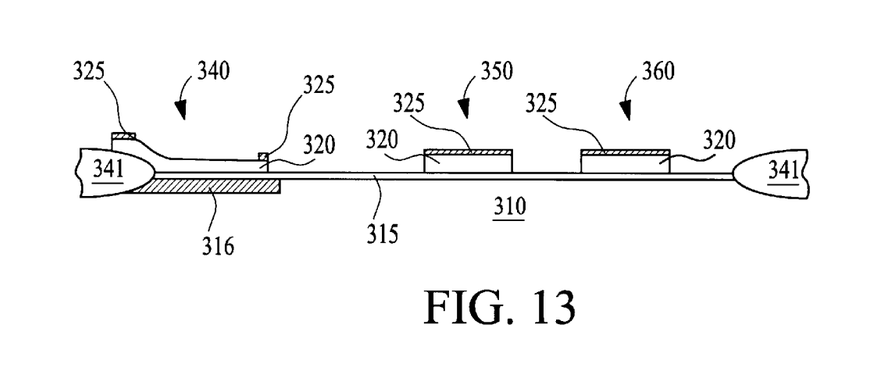
FIG. 13 illustrates a partially cut away side view of a portion of a semiconductor CMOS imager wafer subsequent to FIG. 12.

The conductive layer 325 is removed from the photogate 340 by a wet or dry etch to arrive at the device as shown in FIG. 13. The conductive layer ring 325 remaining after removal of conductive layer 325 over photogate 340 allows a light shield to be aligned over the array while allowing light to pass to the photogate 340.

Figure 14:
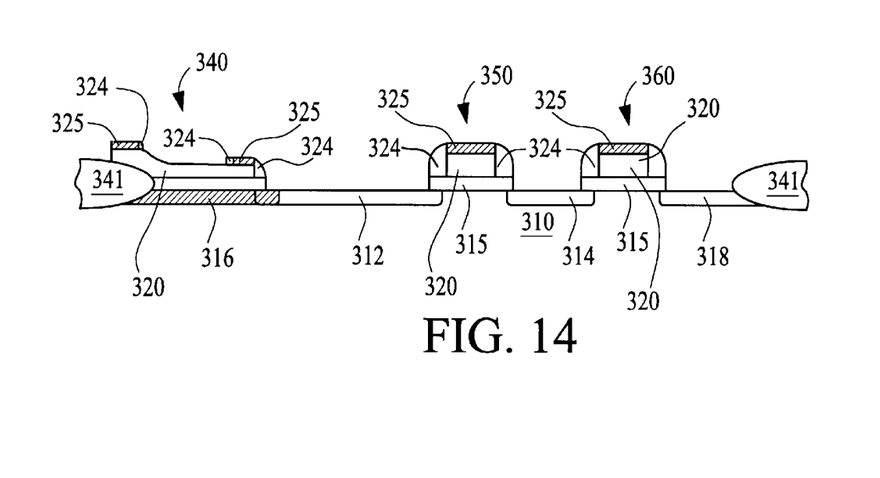
FIG. 14 illustrates a partially cut away side view of a portion of a semiconductor CMOS imager wafer subsequent to FIG. 13.

Spacers 324 are formed along the sides of the gate stacks 340, 350, 360 and the conductive layer ring 325 remaining after etching over the photogate 340 as shown in FIG. 14. The spacers 324 may be formed of any insulator such as oxide or nitride using conventional deposition and anisotropic etch back technique. A resist and mask (not shown) is further used to shield areas of the substrate 310 that are not to be doped. The doped regions 312, 314, 318 are then formed in the substrate 310. The doped regions 312, 314, 318 are doped to a second conductivity type, which for exemplary purposes will be considered to be n-type. The doping level of the doped regions 312 may vary but preferably are heavily n+ doped with arsenic, antimony of phosphorous at a dopant concentration level of from about $1\times10^{15}$ ions/cm$^2$ to about $1\times10^{16}$ ions/cm$^2$. Separate masking photoresist layers may be used to implant regions 312, 314, 318 to differing dopant concentrations or a single mask may be used to implant them all the same concentration.

For the pixel cell of the third embodiment, the photosensor cell is essentially complete at this stage, and conventional processing methods may then be used to form contacts and wiring to connect gate lines and other connections in the pixel cell. For example, the entire surface may then be covered with a passivation layer of, e.g., silicon dioxide, BPSG, PSG, BSG or the like which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 15:
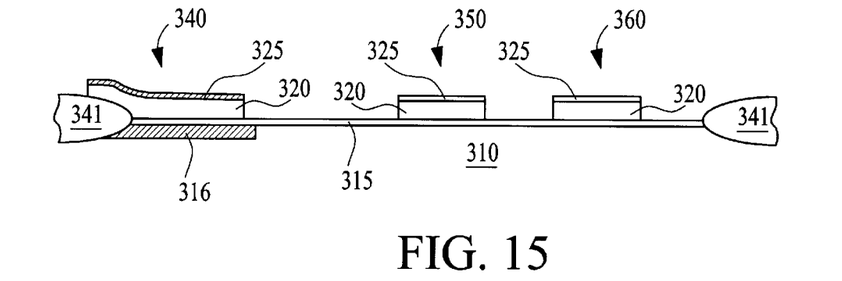
FIG. 15 illustrates a partially cut away side view of a portion of a semiconductor CMOS imager wafer in an interim stage of processing according to a third embodiment of the present invention.

Reference is now made to FIG. 15. This figure shows a partially cut away side view of a portion of a semiconductor CMOS imager wafer in an interim stage of processing according to a third embodiment of the present invention. The imager includes a substrate 310 preferably doped to a first conductivity type. For exemplary purposes, it is assumed that the substrate 310 is a well doped to a p-type conductivity, i.e., a p-well. Substrate 310 has an n-doped region 316 therein for photocollection. An insulating layer 315 is formed over the substrate 310. The insulating layer is preferably a silicon dioxide grown on the substrate 310 by conventional means such as thermal oxidation of silicon. The substrate 310 has field oxide regions 341 formed using the LOCOS process to surround and isolate the cells which may be formed by thermal oxidation. While the invention is described with reference to LOCOS formed field oxide regions 341, it should be understood that the field oxide regions may be formed using replaced with shallow trench isolation (STI).

A photogate 340, a transfer gate 350 and a reset gate 360 have been fabricated over the insulating layer 315. The gates 340, 350, 360 include a doped polysilicon layer 320 covered by a more conductive layer such as a barrier/metal layer or silicide layer 325. Preferably the silicide is a tungsten, titanium, tantalum, molybdenum or cobalt silicide. The barrier metal may be those such as titanium nitride, tungsten nitride or the like. Preferably the barrier metal is formed of a TiN/W, $WN_x/W$ or $WN_x$. The doped polysilicon layers 320 may be formed by conventional methods as described above. Conductive layer 325 of titanium, tantalum, cobalt or tungsten is then deposited using a chemical vapor deposition (CVD) or a physical vapor deposition (PVD) of the silicide or a CVD or PVD deposition of the metal followed by a thermal step to cause the metal to react with the underlying polysilicon to form the metal silicide. The wafer is then annealed at approximately 600° C. to about 800° C. for approximately 30 seconds in a nitrogen environment to react with a portion of the polysilicon layer 320 to form conductive layer 325. The excess metal is then removed. Preferably the conductive layer 325 is formed by depositing $WSi_x$ over the doped polysilicon layers 320. The $WSi_x$ may be deposited onto the doped polysilicon layers 320 by conventional methods such as CVD.

Figure 16:
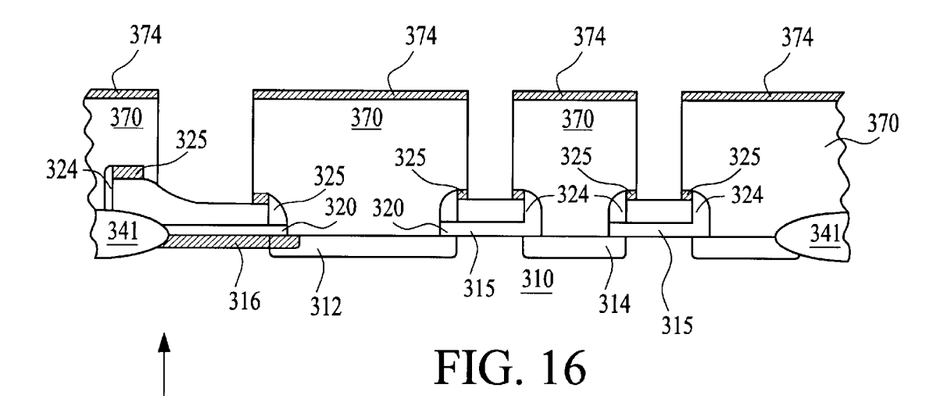
FIG. 16 illustrates a partially cut away side view of a portion of a semiconductor CMOS imager wafer subsequent to FIG. 15.

Reference is made to FIG. 16. Spacers 324 are formed along the sides of the gate stacks 340, 350, 360 and the conductive layer ring 325 remaining after etching over the photogate 340, transfer gate 350 and reset gate 360. The spacers 324 may be formed of any insulator such as oxide or nitride using conventional deposition and anisotropic etch back technique. A resist and mask (not shown) is further used to shield areas of the substrate 310 that are not to be doped. The doped regions 312, 314, 318 are then formed in the substrate 310. The doped regions 312, 314, 318 are doped to a second conductivity type, which for exemplary purposes will be considered to be n-type. The doping level of the doped regions 312 may vary but preferably are heavily n+ doped with arsenic, antimony of phosphorous at a dopant concentration level of from about $1 \times 10^{15}$ ions/cm$^2$ to about $1 \times 10^{16}$ ions/cm$^2$. Separate masking photoresist layers may be used to implant regions 312, 314, 318 to differing dopant concentrations or a single mask may be used to implant them all the same concentration. A resist and mask (not shown) is used to form insulating layer 370 over substrate 310. The insulating layer 370 is formed such that the insulating layer aligns with the remaining conductive layer 325 as shown in FIG. 16.

The insulating layer 370 may be formed of any type of insulating material, such as an oxide or nitride. A light shield 374 is then deposited over insulating layer 374. The light shield layer may be formed of any conventionally known light blocking material. The wafer is then patterned with resist to clear resist over the photogate 340 and wherever a subsequent contact is desired. The light shield 374, insulating layer 370 and conductor 325 are all etched sequentially with a single resist patterning. The resist is stripped and the wafer is as shown in FIG. 16.

Figure 17:
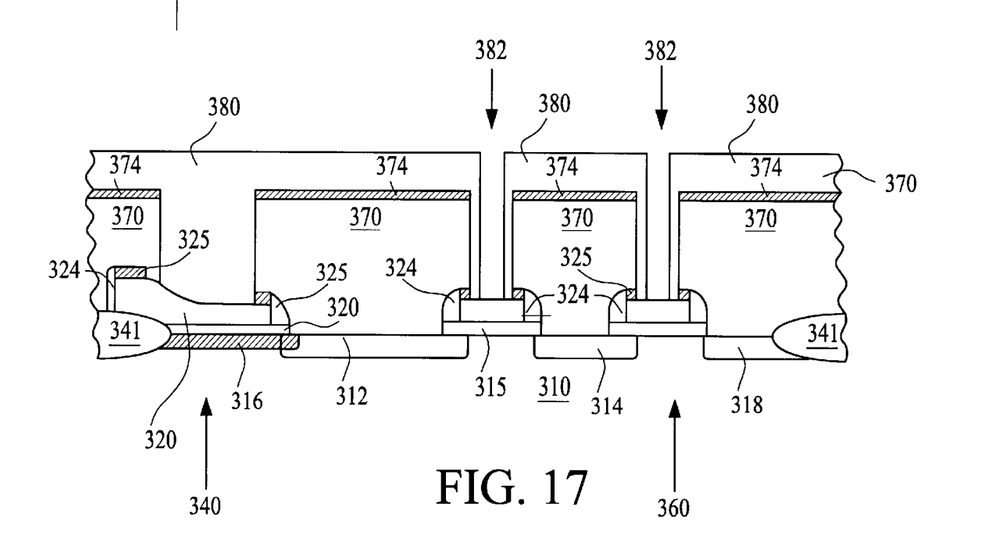
FIG. 17 illustrates a partially cut away side view of a portion of a semiconductor CMOS imager wafer subsequent to FIG. 16.

A translucent or transparent insulating layer 380 is then deposited over the substrate. The substrate is optionally planarized using CMP or spin-on-glass (SOG). Contact holes 382 are formed in insulating layer 380 to arrive at the structure shown in FIG. 17. Insulating layer 380 may be formed of, for example, silicon dioxide, BPSG, PSG, BSG, SOG or the like which is CMP planarized and etched to provide contact holes 382, which are then metallized to provide contacts to the photogate 340, reset gate 350, and transfer gate 360. Conventional multiple layers of conductors and insulators may also be used to interconnect the structures in the manner shown in FIG. 1.

Figure 18:
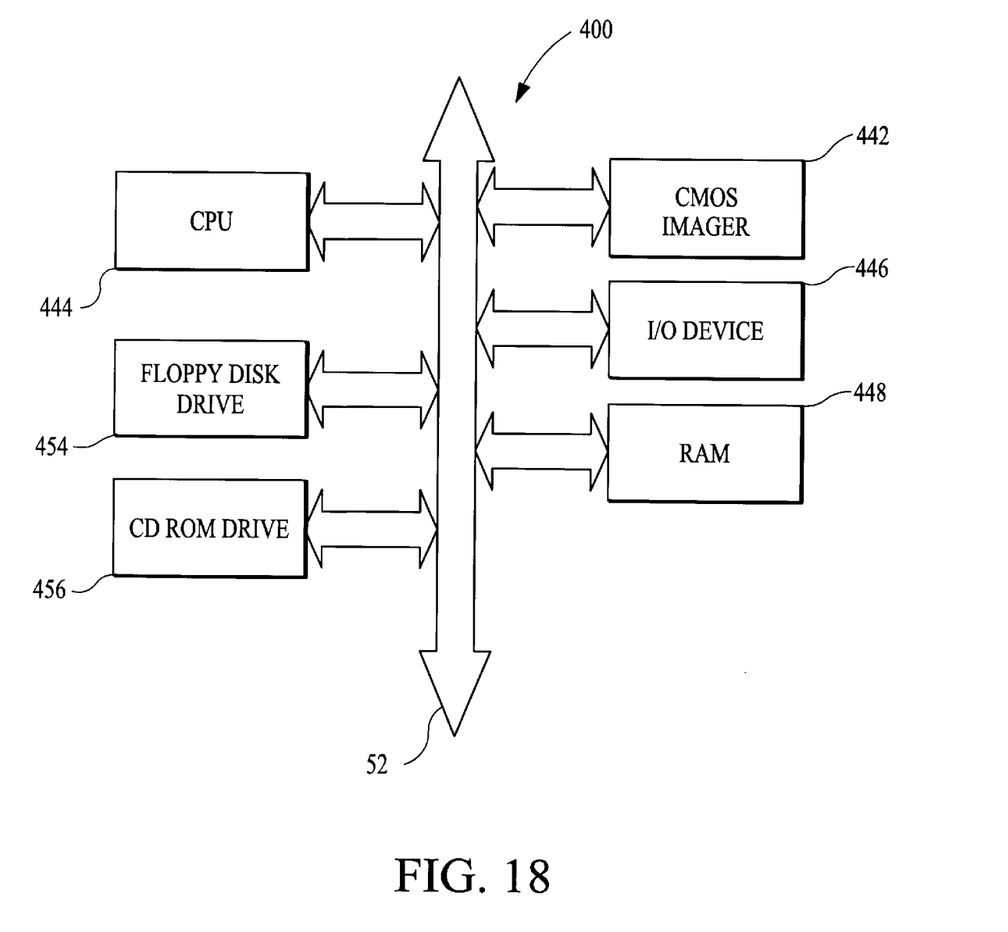
FIG. 18 is an illustration of a computer system having a CMOS imager according to the present invention.

A typical processor based system which includes a CMOS imager device according to the present invention is illustrated generally at 400 in FIG. 18. A processor based system is exemplary of a system having digital circuits which could include CMOS imager devices. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor system, such as a computer system, for example generally comprises a central processing unit (CPU) 444 that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit as previously described with respect to FIGS. 4–17.

The above description and accompanying drawings are only illustrative of preferred embodiments which can achieve the features and advantages of the present invention. For example, the CMOS imager array can be formed on a single chip together with the logic or the logic and array may be formed on separate IC chips. It is not intended that the invention be limited to the embodiments shown and described in detail herein. Accordingly, the invention is not limited by the forgoing descriptions, but is only limited by the scope of the following claims.

What is claimed as new and desired to be protected by Letters Patent of the United States is:

1. A CMOS imager having improved transistor speed comprising:

a substrate;

an array of pixel cells formed on said substrate, each of said cells including a photocollection region, at least one transistor, and a partially removed opaque conductive layer, wherein said transistor includes, over a gate region of the transistor, a remaining portion of said opaque conductive layer, and said photocollection region includes a photogate from which said opaque conductive layer has been removed; and signal processing circuitry on said substrate, wherein said circuitry is connected to said array.

2. The CMOS imager according to claim 1, wherein said opaque conductive layer is an opaque conductive silicide layer.

3. The CMOS imager according to claim 2, wherein said opaque conductive silicide layer is a tungsten silicide.

4. The CMOS imager according to claim 2, wherein said opaque conductive silicide layer is a titanium silicide.

5. The CMOS imager according to claim 2, wherein said opaque conductive silicide layer is a cobalt silicide.

6. The CMOS imager according to claim 2, wherein said opaque conductive silicide layer is a molybdenum silicide.

7. The CMOS imager according to claim 1, wherein said opaque conductive layer is an opaque conductive barrier metal layer.

8. The CMOS imager according to claim 7, wherein said opaque conductive barrier metal layer is a TiN/W layer.

9. The CMOS imager according to claim 7, wherein said opaque conductive barrier metal layer is a $WN_x/W$ layer.

10. The CMOS imager according to claim 7, wherein said opaque conductive barrier metal layer is a $WN_x$ layer.

11. The CMOS imager according to claim 1, wherein said transistor is one or more of a reset transistor, a row select transistor, source follower transistor, amplifier transistor or a transfer transistor.

12. The CMOS imager according to claim 1, wherein said transistor is a reset transistor.

13. The CMOS imager according to claim 12, further comprising a transfer transistor to transfer charge from said photocollection region to said signal processing circuitry, wherein said transfer transistor includes an opaque conductive layer deposited over the gate region of said transistor.

14. The CMOS imager according to claim 1, wherein said imager further includes a thin ring of opaque conductive layer formed over the outer periphery of said photogate.

15. The CMOS imager according to claim 14, wherein said imager further includes a light shield formed over said imager such that said light shield does not cover a substantial portion of said photocollection region.

16. A processing system comprising:
  (i) a processor; and
  (ii) a CMOS imaging device coupled to said processor and including:
    a substrate;
    an array of pixel cells formed on said substrate, each of said cells including a photocollection region, at least one transistor, and a partially removed opaque conductive layer, wherein said transistor includes, over a gate region of the transistor, a remaining portion of said opaque conductive layer, and said photocollection region includes a photogate from which said opaque conductive layer has been removed; and
    signal processing circuitry on said substrate, wherein said circuitry is connected to said array.

17. The system according to claim 16, wherein said opaque conductive layer is an opaque conductive silicide layer.

18. The system according to claim 17, wherein said opaque conductive silicide layer is a tungsten silicide.

19. The system according to claim 17, wherein said opaque conductive silicide layer is a titanium silicide.

20. The system according to claim 17, wherein said opaque conductive silicide layer is a cobalt silicide.

21. The system according to claim 17, wherein said opaque conductive silicide layer is a molybdenum silicide.

22. The system according to claim 16, wherein said opaque conductive layer is an opaque conductive barrier metal layer.

23. The system according to claim 22, wherein said opaque conductive barrier metal layer is a TiN/W layer.

24. The system according to claim 22, wherein said opaque conductive barrier metal layer is a $WN_x$/W layer.

25. The system according to claim 22, wherein said opaque conductive barrier metal layer is a $WN_x$ layer.

26. The system according to claim 16, wherein said transistor is one or more of a reset transistor, a row select transistor, an amplifying transistor, a source follower transistor or a transfer transistor.

27. The system according to claim 16, wherein said transistor is a reset transistor.

28. The system according to claim 27, further comprising a transfer transistor to transfer charge from said photocollection region to said signal processing circuitry, wherein said transfer transistor includes an opaque conductive layer deposited over the gate region of said transistor.

29. The system according to claim 16, wherein said imager further includes a thin ring of opaque conductive layer formed over the outer periphery of said photogate.

30. The system according to claim 29, wherein said imager further includes a light shield formed over said imager such that said light shield does not cover a substantial portion of said photocollection region.

31. A CMOS imager having improved transistor speed comprising:
  a substrate;
  an array of pixel cells formed on said substrate, each of said cells including a photocollection region with an etched photogate, and at least one transistor having a portion of a deposited opaque conductive layer over a gate region of the transistor; and
  signal processing circuitry on said substrate, wherein said circuitry is connected to said array,
  wherein said photogate is void of said deposited opaque conductive layer.

32. A processing system comprising:
  (i) a processor; and
  (ii) a CMOS imaging device coupled to said processor and including:
    a substrate;
    an array of pixel cells formed on said substrate, each of said cells including a photocollection region with an etched photogate, and at least one transistor having a portion of a deposited opaque conductive layer over a gate region of the transistor; and
    signal processing circuitry on said substrate, wherein said circuitry is connected to said array,
    wherein said photogate is void of said deposited opaque conductive layer.

* * * * *

UNITED STATES PATENT AND TRADEMARK OFFICE
CERTIFICATE OF CORRECTION

PATENT NO. : 6,611,013 B2 Page 1 of 1
APPLICATION NO. : 09/777890
DATED : August 26, 2003
INVENTOR(S) : Howard E. Rhodes It is certified that error appears in the above-identified patent and that said Letters Patent is hereby corrected as shown below:

On the Title page Item (62) "Pat. No. 6,333,705." should read -- Pat. No. 6,333,205. --

Signed and Sealed this

Third Day of August, 2010

David J. Kappos
*Director of the United States Patent and Trademark Office*